United States Patent
Liang et al.

(10) Patent No.: US 9,881,837 B2
(45) Date of Patent: Jan. 30, 2018

(54) FIN-LIKE FIELD EFFECT TRANSISTOR (FINFET) BASED, METAL-SEMICONDUCTOR ALLOY FUSE DEVICE AND METHOD OF MANUFACTURING SAME

(71) Applicant: Taiwan Semiconductor Manufacturing Company, Ltd., Hsin-Chu (TW)

(72) Inventors: Min-Chang Liang, Zhu-Dong Town (TW); Shien-Yang Wu, Jhudong Town (TW); Wei-Chang Kung, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/636,766

(22) Filed: Mar. 3, 2015

(65) Prior Publication Data
US 2015/0179524 A1    Jun. 25, 2015

Related U.S. Application Data

(62) Division of application No. 13/283,127, filed on Oct. 27, 2011, now Pat. No. 8,969,999.

(51) Int. Cl.
| | |
|---|---|
| *H01L 21/02* | (2006.01) |
| *H01L 21/762* | (2006.01) |
| *H01L 23/525* | (2006.01) |
| *H01L 21/8234* | (2006.01) |
| *H01L 27/112* | (2006.01) |
| *H01L 29/66* | (2006.01) |
| *H01L 29/78* | (2006.01) |

(Continued)

(52) U.S. Cl.
CPC .............. *H01L 21/823431* (2013.01); *H01L 21/02647* (2013.01); *H01L 21/76224* (2013.01); *H01L 21/823481* (2013.01); *H01L 23/5256* (2013.01); *H01L 27/11206* (2013.01); *H01L 29/1087* (2013.01); *H01L 29/665* (2013.01); *H01L 29/6681* (2013.01); *H01L 29/66545* (2013.01); *H01L 27/1052* (2013.01); *H01L 29/785* (2013.01); *H01L 2924/0002* (2013.01)

(58) Field of Classification Search
USPC ........ 257/209, 347, 529; 438/131, 132, 215, 438/281, 333, 467, 600, 601
See application file for complete search history.

(56) References Cited

U.S. PATENT DOCUMENTS

| | | | | |
|---|---|---|---|---|
| 6,436,738 B1 * | 8/2002 | Yu | ........................ | H01L 23/5256 257/529 |
| 7,402,855 B2 * | 7/2008 | Kurjanowicz | ......... | G11C 17/16 257/288 |
| 7,662,674 B2 | 2/2010 | Yu | | |

(Continued)

*Primary Examiner* — Mark Tornow
*Assistant Examiner* — Priya Rampersaud
(74) *Attorney, Agent, or Firm* — Haynes and Boone, LLP

(57) ABSTRACT

A fuse device and method for fabricating the fuse device is disclosed. An exemplary fuse device includes a first contact and a second contact coupled with a metal-semiconductor alloy layer, wherein the metal-semiconductor alloy layer extends continuously between the first contact and the second contact. The metal-semiconductor alloy layer is disposed over an epitaxial layer that is disposed over a fin structure of a substrate.

20 Claims, 11 Drawing Sheets

(51) Int. Cl.
  *H01L 29/10* (2006.01)
  *H01L 27/105* (2006.01)

(56) References Cited

U.S. PATENT DOCUMENTS

| | | | |
|---|---|---|---|
| 2005/0145938 A1* | 7/2005 | Lin | H01L 27/1203 |
| | | | 257/347 |
| 2006/0128071 A1 | 6/2006 | Rankin et al. | |
| 2007/0029576 A1* | 2/2007 | Nowak | H01L 27/10 |
| | | | 257/209 |
| 2008/0067629 A1 | 3/2008 | Miyashita | |
| 2009/0181477 A1 | 7/2009 | King et al. | |
| 2009/0206446 A1 | 8/2009 | Russ et al. | |
| 2011/0031582 A1* | 2/2011 | Booth, Jr. | H01L 23/5252 |
| | | | 257/530 |
| 2011/0049613 A1 | 3/2011 | Yeh et al. | |
| 2011/0278676 A1* | 11/2011 | Cheng | H01L 21/823807 |
| | | | 257/369 |
| 2013/0105895 A1 | 5/2013 | Liang | |
| 2013/0153960 A1 | 6/2013 | Yang | |
| 2013/0270559 A1* | 10/2013 | Hafez | H01L 27/11206 |
| | | | 257/50 |

* cited by examiner

FIN-LIKE FIELD EFFECT TRANSISTOR (FINFET) BASED, METAL-SEMICONDUCTOR ALLOY FUSE DEVICE AND METHOD OF MANUFACTURING SAME

PRIORITY DATA

The present application is a divisional application of U.S. patent application Ser. No. 13/283,127, filed Oct. 27, 2011, which is incorporated herein by reference in its entirety.

BACKGROUND

Fuses are widely implemented in integrated circuit devices, particularly in integrated circuit memory devices, to provide discretionary electrical connections. For example, in dynamic or static memory chips, defective memory cells or circuitry may be replaced by selectively blowing (destroying) fuses associated with the defective circuitry while activating redundant circuitry. Fuses are also used for programming functions and codes in logic chips, as well as programming redundant rows of memory chips. To provide such discretionary electrical connections, fuses include a fuse element that is broken (blown) by using electrical current flowing through the fuse element, or an external heat source, such as a laser beam. An exemplary fuse element is a polysilicon fuse element, which provides desirable programming current (current that needs to flow through the fuse element to break the fuse element). However, as device technology nodes decrease and high-k/metal gate technology is implemented (where a gate dielectric and polysilicon gate electrode are replaced with a high-k dielectric and metal gate electrode, respectively), polysilicon fuse elements have been replaced by metal fuse elements, such as copper fuse elements, because polysilicon fuse element processing is not compatible with high-k/metal gate processing. Though copper fuse element processing is compatible with high-k/metal gate processing, copper fuse elements require a higher programming current than desirable, typically several times larger than polysilicon fuse elements. Further, copper fuse element characteristics can be modified during subsequent process development. Accordingly, although existing fuses and methods for fabricating fuses have been generally adequate for their intended purposes they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
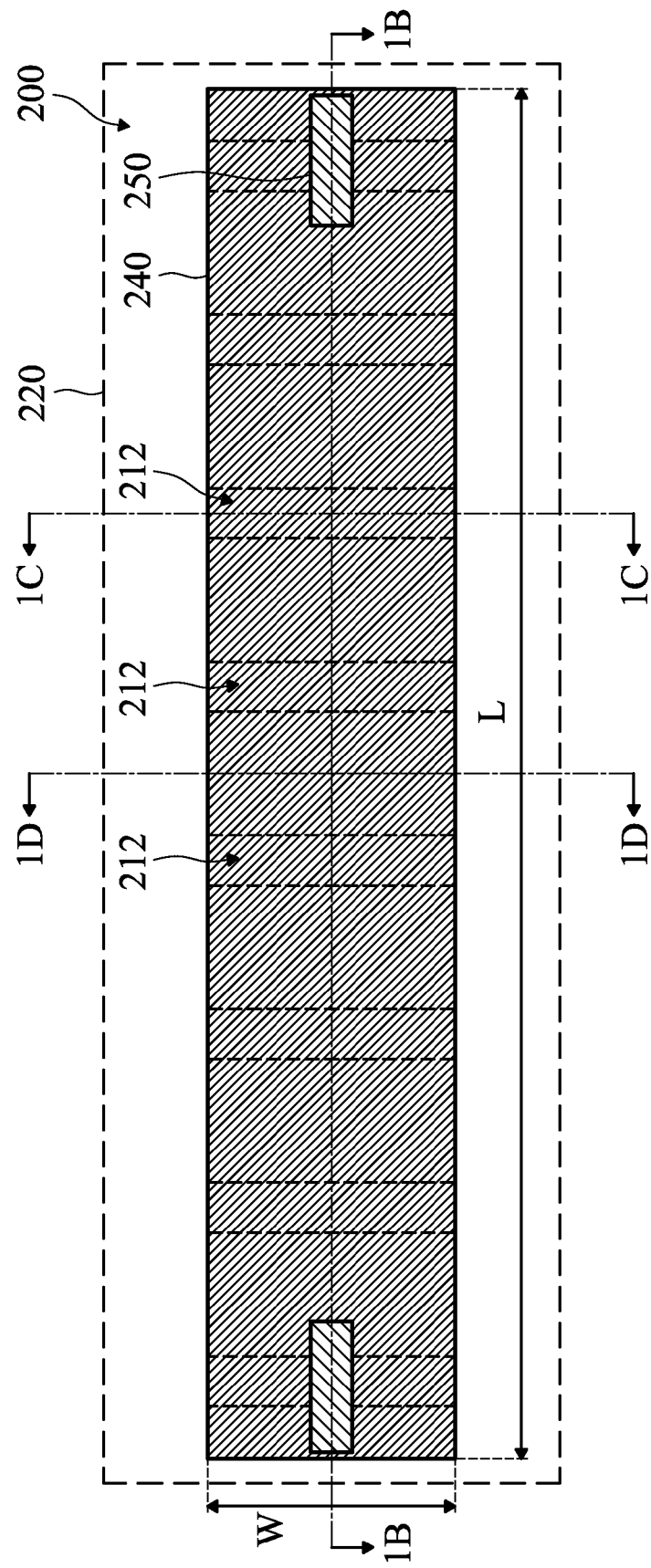
FIG. 1A is a top view of an embodiment of a fuse device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1B:
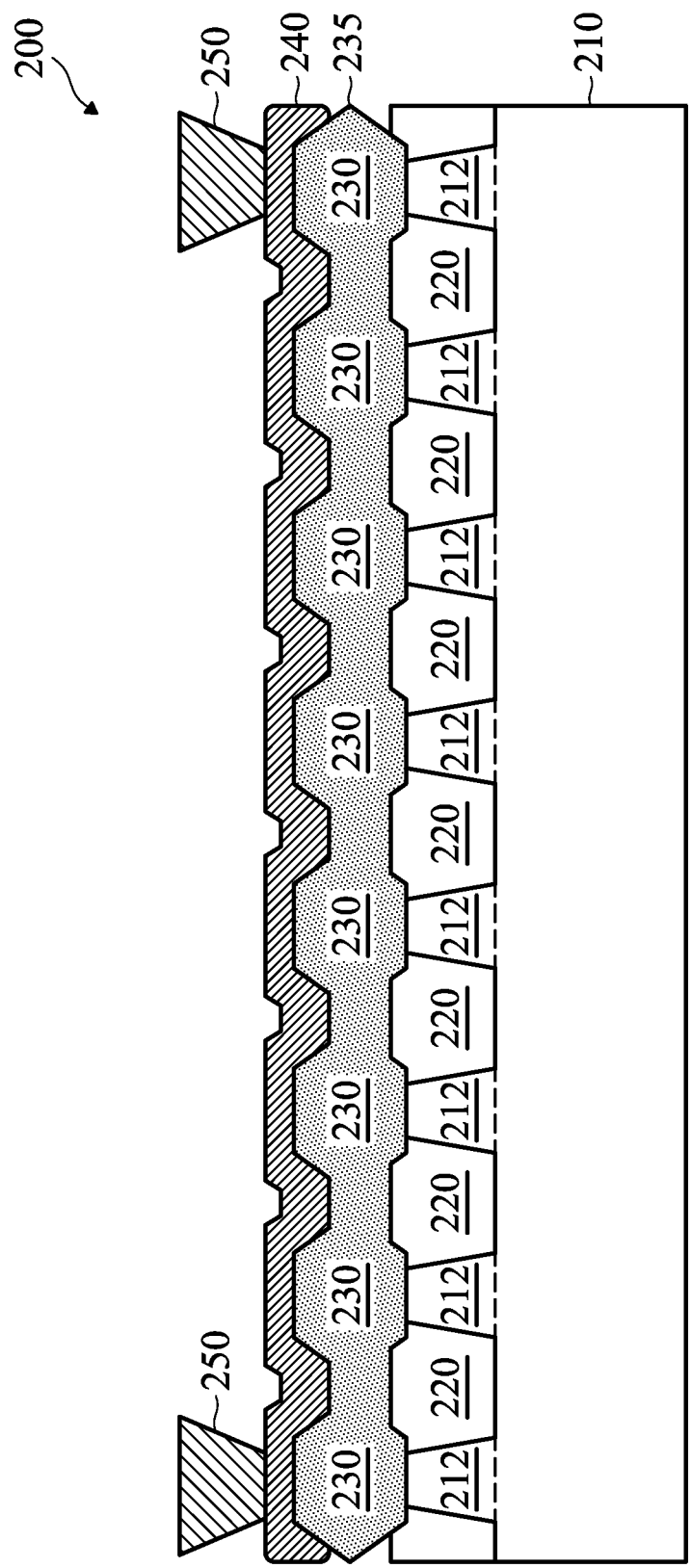
FIG. 1B is a diagrammatic cross-sectional view of the fuse device along line 1B-1B in FIG. 1A.
Figure 1C:
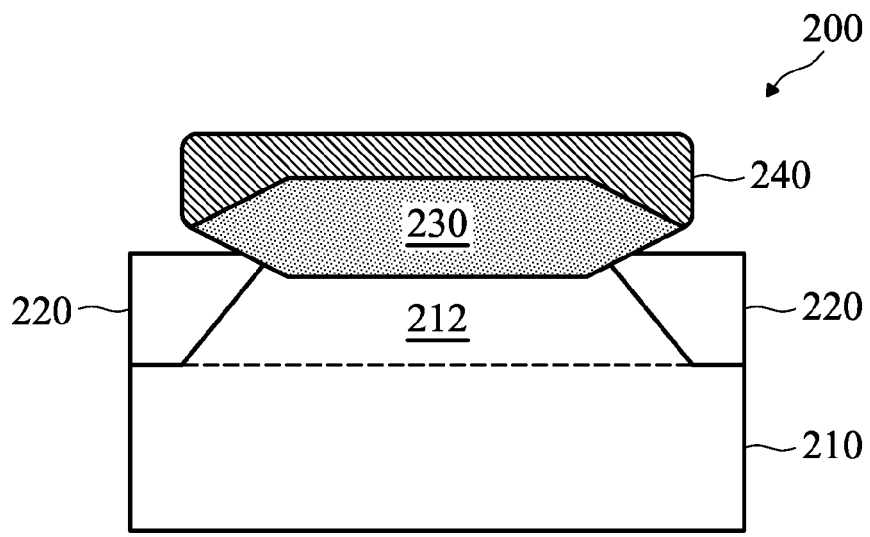
FIG. 1C is a diagrammatic cross-sectional view of the fuse device along line 1C-1C in FIG. 1A.
Figure 1D:
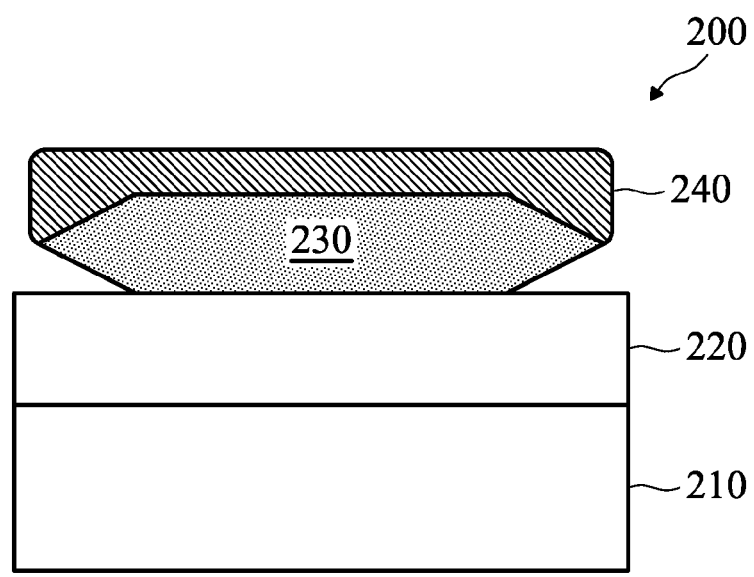
FIG. 1D is a diagrammatic cross-sectional view of the fuse device along line 1D-1D in FIG. 1A.

FIG. 1A is a top view of a fuse device 200, in portion or entirety, according to various aspects of the present disclosure. FIG. 1B is a diagrammatic cross-sectional view of the fuse device 200 along line 1B-1B in FIG. 1A; FIG. 1C is a diagrammatic cross-sectional view of the fuse device 200 along line 1C-1C in FIG. 1A; and FIG. 1D is a diagrammatic cross-sectional view of the fuse device 200 along line 1D-1D in FIG. 1A. The fuse device 200 is a fin-like field effect transistor (FinFET) based, metal-semiconductor alloy fuse device. The term FinFET device refers to any fin-based, single or multi-gate transistor. The FinFET based, metal-semiconductor alloy fuse device 200 may be included in a microprocessor, memory cell, and/or other integrated circuit device. FIGS. 1A-1D will be discussed concurrently and have been simplified for the sake of clarity to better understand the inventive concepts of the present disclosure. Further, additional features can be added in the fuse device 200, and some of the features described below can be replaced or eliminated in other embodiments of the fuse device.

The metal-semiconductor alloy feature fuse device 200 has a dimension that runs in a first direction and a dimension that runs in a second direction that is different than the first direction. For example, the fuse device 200 has a length, L, and a width, W. The fuse device 200 includes a substrate (wafer) 210. In the depicted embodiment, the substrate 210 is a silicon substrate. Alternatively or additionally, the substrate 210 includes an elementary semiconductor, such as germanium; a compound semiconductor, such as silicon carbide, gallium arsenic, gallium phosphide, indium phosphide, indium arsenide, and/or indium antimonide; or combinations thereof. Alternatively, the substrate 210 is a silicon-on-insulator (SOI) substrate. The SOI substrate can be fabricated using separation by implantation of oxygen (SIMOX), wafer bonding, and/or other suitable methods. The substrate 210 may include various doped regions and other suitable features.

A fin structure that includes fins 212 extends from the substrate 210. The fuse device 200 may include more or less fins 212 depending on design requirements of the fuse device 200. In the depicted embodiment, the fins 212 are extensions of the substrate 210 and include silicon. The fins 212 may include other material portions. The fin structure is formed by implementing a lithography and etching process. For example, beginning with the substrate 210, a lithography and etching process forms trenches in the substrate 210, thereby forming fins 212 that extend from the substrate 210. The lithography process may include resist coating (for example, spin-on coating), soft baking, mask aligning, exposure, post-exposure baking, developing the resist, rinsing, drying (for example, hard baking), other suitable processes, or combinations thereof. Alternatively, the lithography process can be implemented or replaced by other methods, such as maskless lithography, electron-beam writing, ion-beam writing, and/or nanoimprint technology. The etching process includes a dry etching process, wet etching process, other suitable etching process, or combinations thereof. In an example, the fins 212 are formed by forming a resist layer over the substrate 210, exposing the resist to a pattern, and developing the resist to form a masking element including the resist. The masking element may then be used to etch the fins 212 into the substrate 210, for example, by using a reactive ion etch (RIE). The fins 212 may be formed by a double-patterning lithography (DPL) process. DPL is a method of constructing a pattern on a substrate by dividing the pattern into two interleaved patterns. DPL allows enhanced feature (for example, fin) density. Various DPL methodologies may be used including double exposure (such as using two mask sets), resist freezing, other suitable processes, or combinations thereof.

Isolation feature 220, such as shallow trench isolation (STI) structure and/or local oxidation of silicon (LOCOS) structure, surrounds the fin structure (in the depicted embodiment, the fins 212) and isolates the fins 212 from each other. Where the fuse device 200 is a portion of a microprocessor, memory cell, or other integrated circuit device, the isolation feature 220 may isolate the fuse device 200 from other devices and/or features of such microprocessor, memory cell, or other integrated circuit device. The isolation feature 220 includes silicon oxide, silicon nitride, silicon oxynitride, other suitable material, or combinations thereof. In the depicted embodiment, the isolation feature 220 includes an oxide material, such as silicon oxide. The filled trenches may have a multi-layer structure, for example, a thermal oxide liner layer with silicon nitride filling the trench. The isolation features 212 are formed by any suitable process. For example, in the depicted embodiment, the isolation feature 220 may be formed by completely or partially filling the trenches etched in the substrate 210 to form the fins 212 with an insulating material.

An epitaxial feature 230 is disposed over each fin 212 of the fin structure. In the depicted embodiment, the epitaxial features 230 are merged together to form a continuous epitaxial feature 235. The epitaxial features 230 are formed by epitaxially (epi) growing a semiconductor material on exposed portions of the fins 212. In the depicted embodiment, the semiconductor material is epitaxially grown by an epi process until the epitaxial features 230 of the fins 212 are merged together to form the continuous epitaxial feature 235. The epitaxy process may use CVD deposition techniques (such as vapor-phase epitaxy (VPE) and/or ultra-high vacuum CVD (UHV-CVD)), molecular beam epitaxy, other suitable processes, or combinations thereof. The epitaxy process may use gaseous and/or liquid precursors. In the depicted embodiment, the epitaxial features 230 (and thus the continuous epitaxial feature 235) includes silicon germanium (SiGe) formed by a silicon germanium epitaxial process. The silicon germanium can reduce heat transfer to the substrate 210. Alternatively, the epitaxial features 230 (continuous epitaxial feature 235) includes other epitaxial materials. Such epitaxial materials may be selected from epitaxial materials having a desired thermal characteristic, such as a low thermal conductivity. For example, the selected epitaxial materials may exhibit a thermal resistance that reduces heat conduction to the substrate 210. The epitaxial features 230 (continuous epitaxial feature 235) may be doped during deposition (growth) by adding impurities to the source material of the epitaxy process or subsequent to its deposition growth process by an ion implantation process. The doped epitaxial layer may have a gradient doping profile. A chemical mechanical polishing (CMP) process may be performed to planarize the epitaxial features 230 (continuous epitaxial feature 235).

A metal-semiconductor alloy feature 240 is disposed over the epitaxial features 230, and in the depicted embodiment, over the continuous epitaxial feature 235. In the depicted embodiment, the metal-semiconductor alloy feature 240 includes a silicide material, such as nickel silicide, cobalt silicide, tungsten silicide, tantalum silicide, titanium silicide, platinum silicide, erbium silicide, palladium silicide, other suitable silicides, or combinations thereof. The metal-semiconductor alloy feature 240 may be formed by a silicidation process, such as a self-aligned silicide (salicide) process.

Contacts 250 are disposed over and electrically coupled with the metal-semiconductor alloy feature 240. The metal-semiconductor alloy feature 240 extends continuously and unbroken between the contacts 250, and the metal-semiconductor alloy 240 serves as a fuse element of the fuse device 200. The contacts 250 include a conductive material, such as aluminum, copper, titanium, tantalum, tungsten, other conductive material, alloys thereof, or combinations thereof. In the depicted embodiment, one of the contacts 250 is an anode of the fuse device 200 and one of the contacts 250 is a cathode of the fuse device 200.

In operation, the contacts 250 are biased (voltage is applied thereto) such that current flows into the contact 250 serving as the anode through the metal-semiconductor alloy feature 240 to the contact 250 serving as the cathode. When a programming current of the fuse device 200 is reached by biasing the contacts 250, a discontinuity occurs in the metal-semiconductor alloy feature 240 that prevents current from flowing from the anode to the cathode via the metal-semiconductor alloy feature 240, thereby breaking (blowing) the fuse device 200. For example, the discontinuity may occur when a portion of the metal-semiconductor alloy feature 240 melts from heat generated by the flowing current. During operation, heat generated by the current flowing from the anode to the cathode via the metal-semiconductor alloy feature 240 is largely constrained by the epitaxial features 230 (in the depicted embodiment, the continuous epitaxial feature 235) and the isolation feature 220 from flowing into the substrate 210. Such heat constraint can ensure that the fuse device 200 breaks at its designed programming current.

Characteristics of the fuse element, the metal-semiconductor alloy feature 240, of the fuse device 200 may be similar to characteristics of polysilicon fuse elements implemented in conventional fuse devices. For example, similar to fuse devices having polysilicon fuse elements, the fuse device 200 having the metal-semiconductor alloy feature 240 (metal-semiconductor alloy fuse element) functions at lower programming current than that required for conventional fuse devices having copper fuse elements. Specifically, it has been observed that the programming current of the fuse device 200 is as much as one order of magnitude lower than the programming current of a fuse device having a copper fuse element (for example, the programming current of the fuse device having the metal-semiconductor alloy fuse element may be about $2.00 \times 10^{-3}$ A (amps), whereas the programming current of the fuse device having the copper fuse element may be about $1.75 \times 10^{-2}$ A). In the depicted embodiment, as noted, the epitaxial features 230 (continuous epitaxial feature 235) contribute to maintaining the lower programming current of the fuse device 200 having the metal-semiconductor alloy feature 240 (metal-semiconductor alloy fuse element) by preventing or reducing heat generated during operation from flowing to the substrate 210. Further, as described further below, while providing desirable programming current, the fuse device 200 having the metal-semiconductor alloy feature 240 (metal-semiconductor alloy fuse element) is easily implemented in high-k/metal gate processing, as compared to fuse devices having polysilicon fuse elements. The fuse device 200 thus achieves desirable operating characteristics, such as those achieved by fuse devices having polysilicon fuse elements, while achieving desirable compatibility in conventional processing, such as that achieved by fuse devices having copper fuse elements. Even further, when compared to fuse devices having copper fuse elements, the fuse device 200 having the metal-semiconductor alloy feature 240 (metal-semiconductor alloy fuse element) can maintain its characteristics during subsequent process development and optimization, thus minimizing possible design changes at later process development stages. Different embodiments may have different advantages, and no particularly advantage is necessarily required of any embodiment.

Figure 2A:
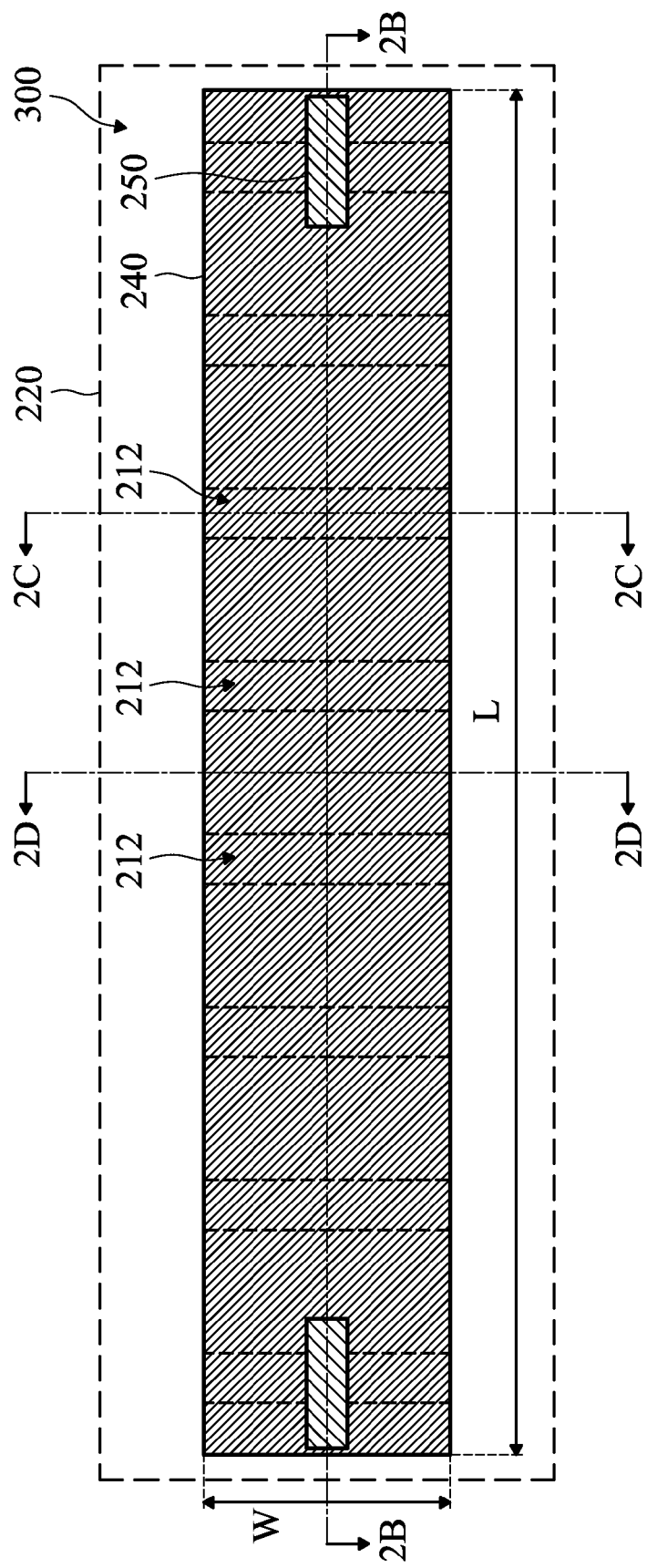
FIG. 2A is a top view of another embodiment of a fuse device according to various aspects of the present disclosure.
Figure 2B:
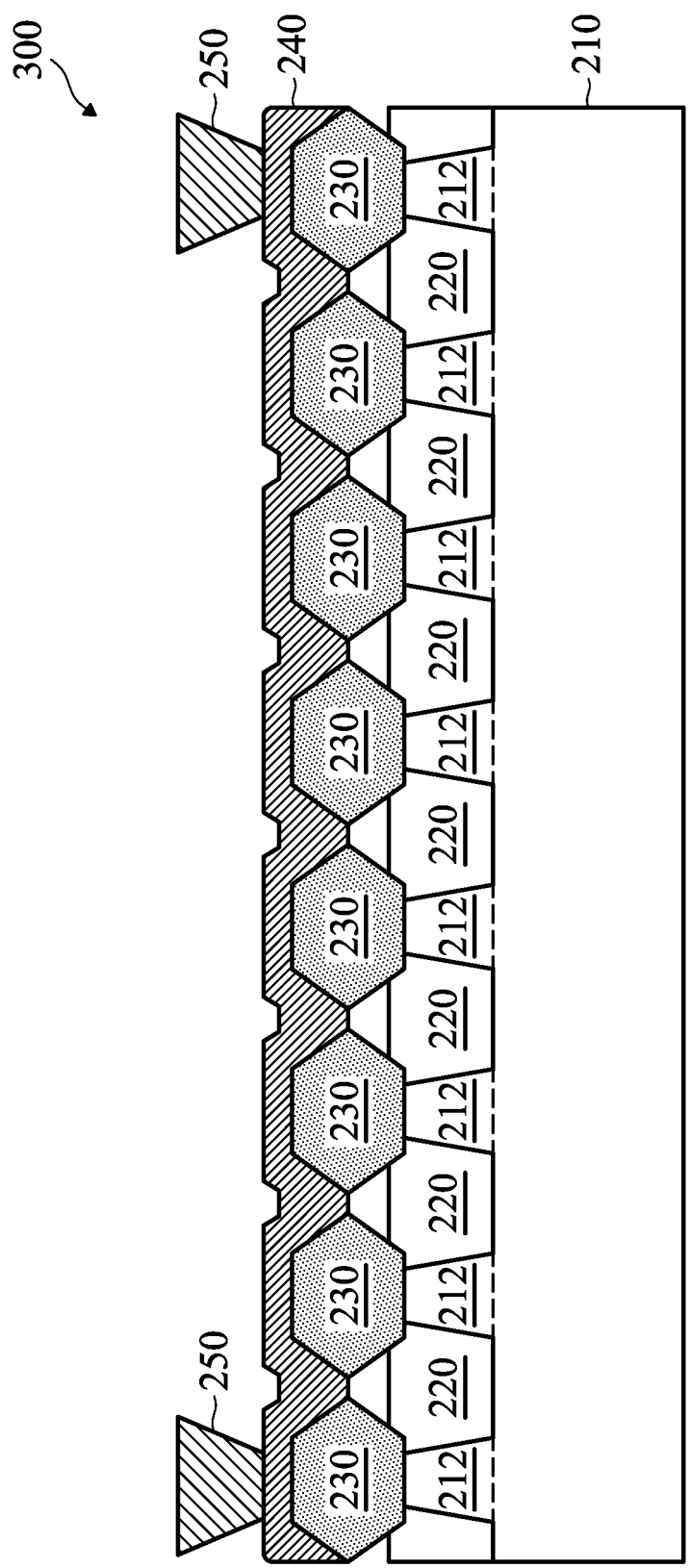
FIG. 2B is a diagrammatic cross-sectional view of the fuse device along line 2B-2B in FIG. 2A.
Figure 2C:
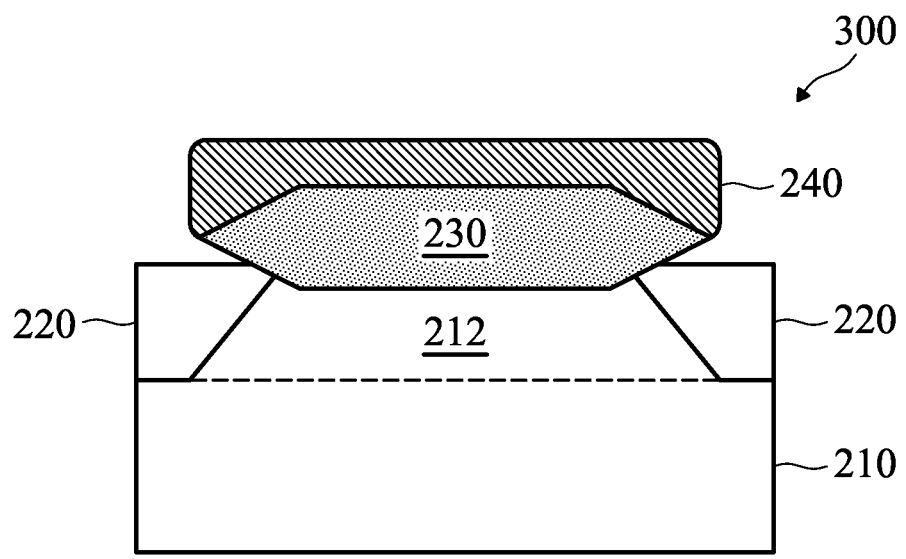
FIG. 2C is a diagrammatic cross-sectional view of the fuse device along line 2C-2C in FIG. 2A.
Figure 2D:
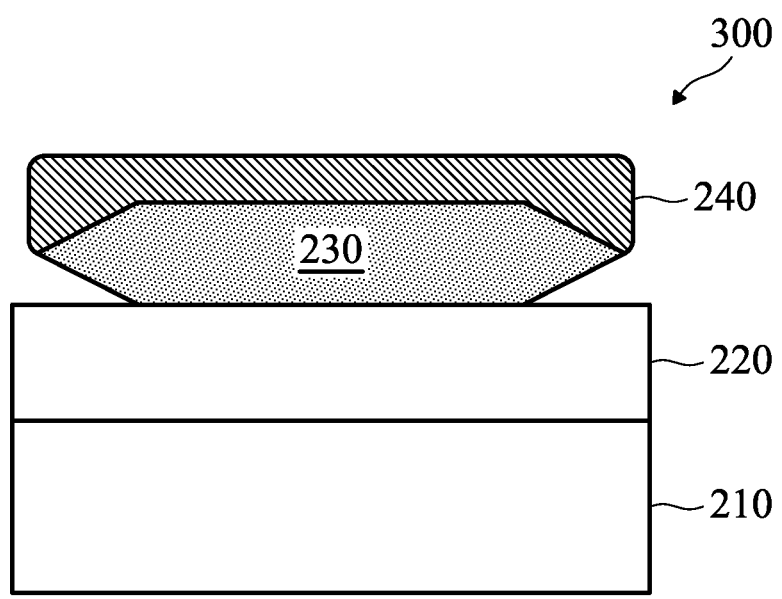
FIG. 2D is a diagrammatic cross-sectional view of the fuse device along line 2D-2D in FIG. 2A.

FIG. 2A is a top view of a fuse device 300, in portion or entirety, according to various aspects of the present disclosure. FIG. 2B is a diagrammatic cross-sectional view of the fuse device 300 along line 2B-2B in FIG. 2A; FIG. 2C is a diagrammatic cross-sectional view of the fuse device 300 along line 2C-2C in FIG. 2A; and FIG. 2D is a diagrammatic cross-sectional view of the fuse device 300 along line 2D-2D in FIG. 2A. FIGS. 2A-2D will be discussed concurrently and have been simplified for the sake of clarity to better understand the inventive concepts of the present disclosure. The embodiment of FIGS. 2A-2D is similar in many respects to the embodiment of FIGS. 1A-1D. Accordingly, similar features in FIGS. 1A-1D and FIGS. 2A-2D are identified by the same reference numerals for clarity and simplicity. In the fuse device 300, the epitaxial features 230 do not merge together to form the continuous epitaxial feature 235. However, the epitaxial features 230 are proximate to one another, such that metal-semiconductor alloy features formed on the epitaxial features 230 (also referred to as epitaxial islands) merge together to form the metal-semiconductor alloy feature 240, which extends continuously and unbroken between the contacts 250. In an example, a distance between adjacent epitaxial features 230 is less than or equal to about 10 nm. Additional features can be added in the fuse device 300, and some of the features described below can be replaced or eliminated for other embodiments of the fuse device 300.

Figure 3A:
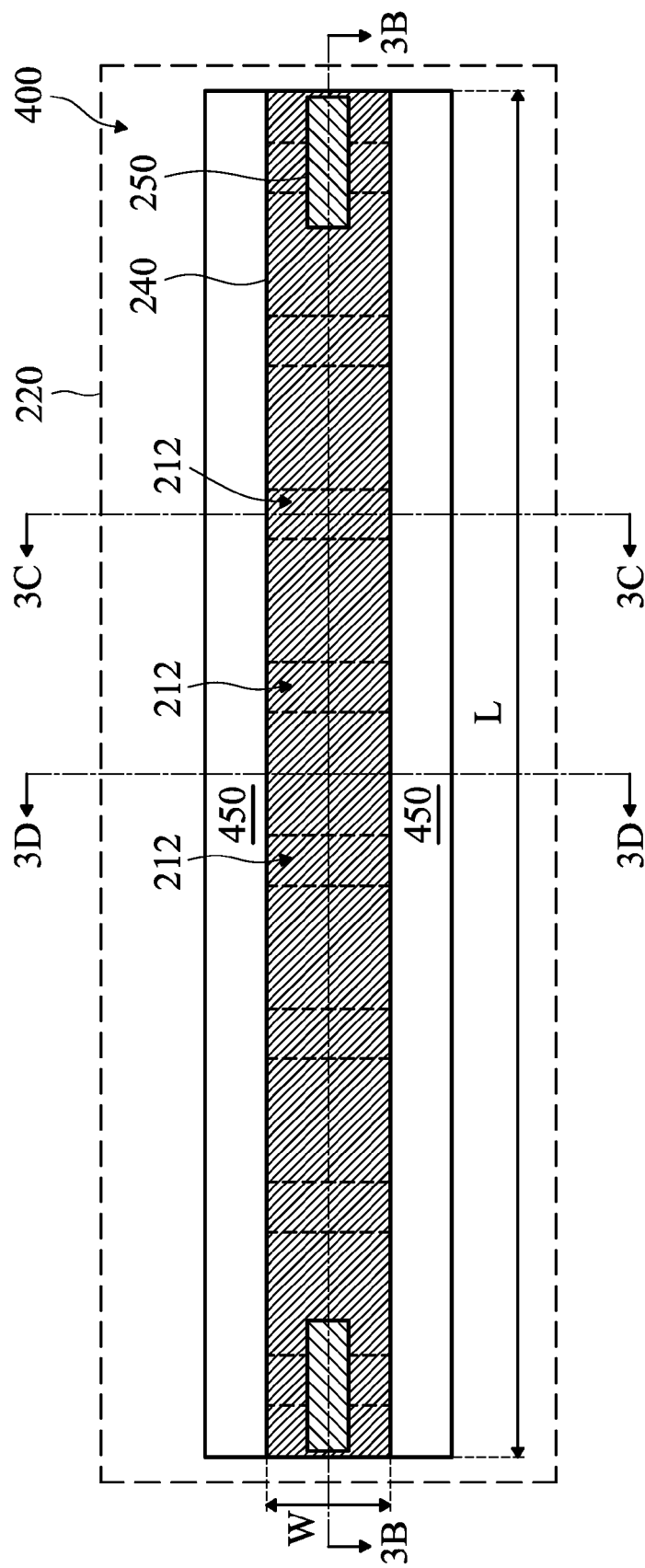
FIG. 3A is a top view of yet another embodiment of a fuse device according to various aspects of the present disclosure.
Figure 3B:
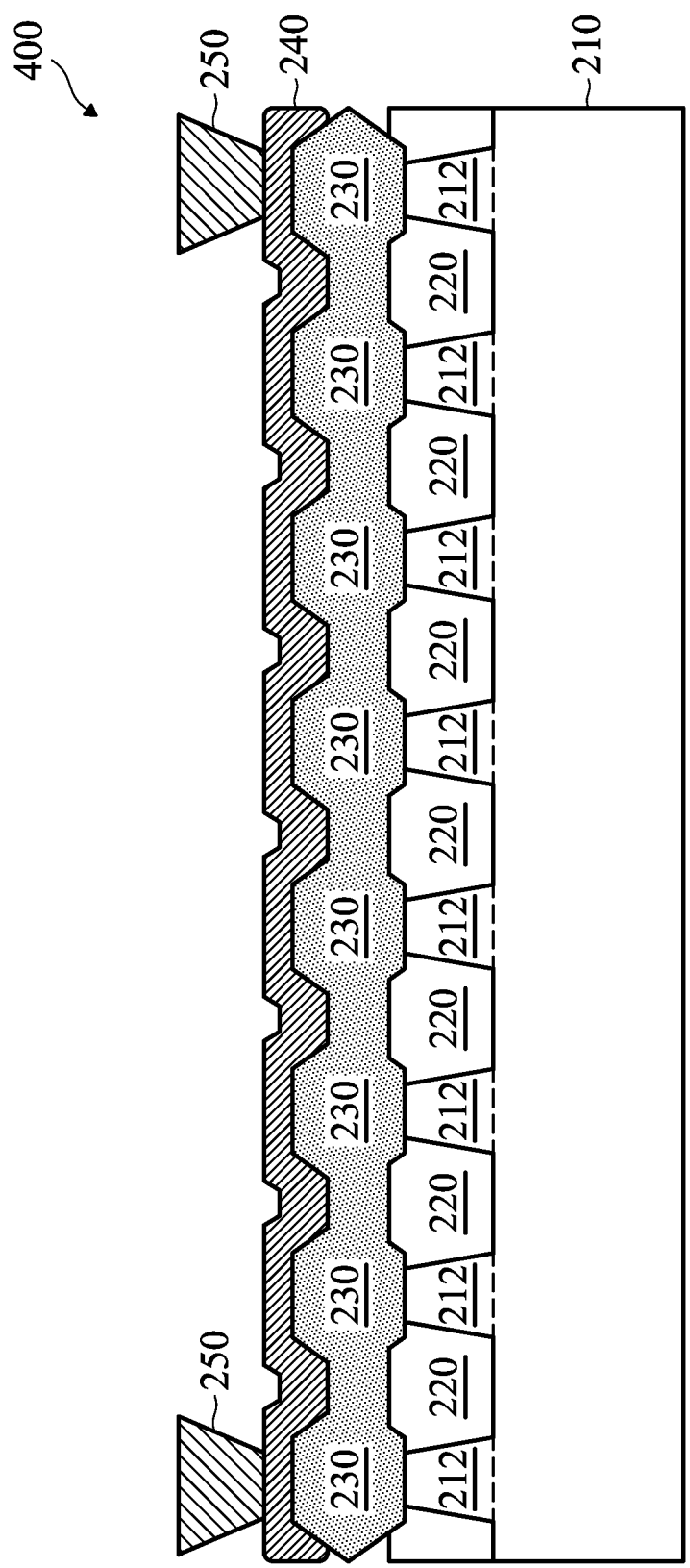
FIG. 3B is a diagrammatic cross-sectional view of the fuse device along line 3B-3B in FIG. 3A.
Figure 3C:
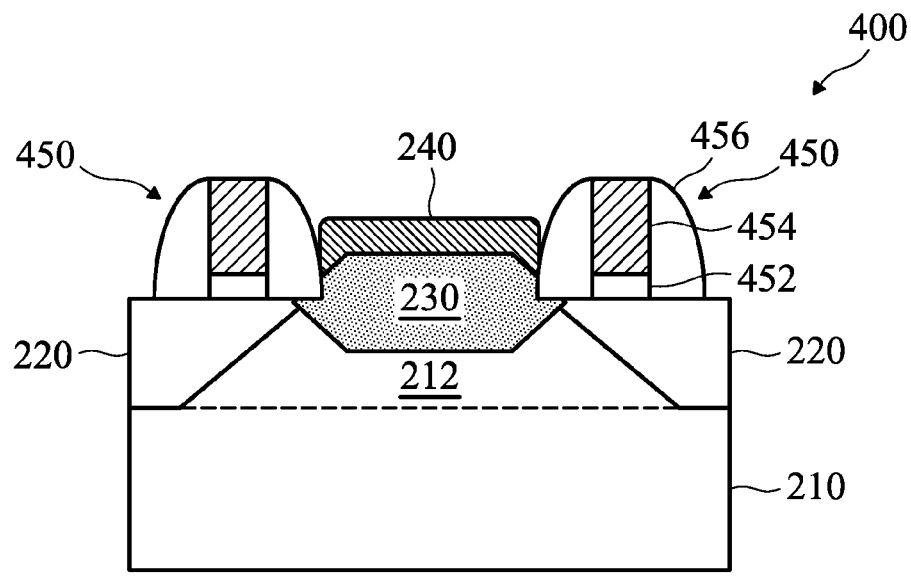
FIG. 3C is a diagrammatic cross-sectional view of the fuse device along line 3C-3C in FIG. 3A.
Figure 3D:
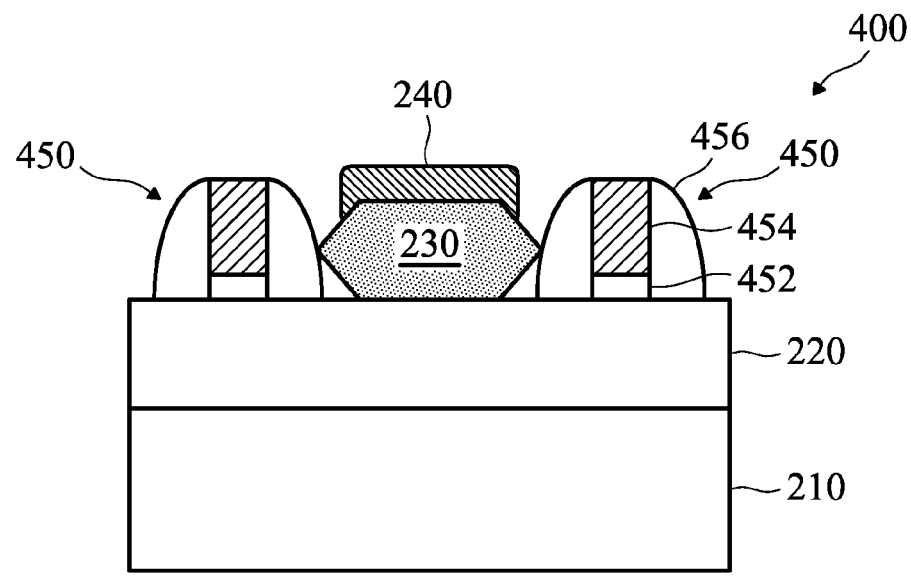
FIG. 3D is a diagrammatic cross-sectional view of the fuse device along line 3D-3D in FIG. 3A.

FIG. 3A is a top view of a fuse device 400, in portion or entirety, according to various aspects of the present disclosure. FIG. 3B is a diagrammatic cross-sectional view of the fuse device 400 along line 3B-3B in FIG. 3A; FIG. 3C is a diagrammatic cross-sectional view of the fuse device 400 along line 3C-3C in FIG. 3A; and FIG. 3D is a diagrammatic cross-sectional view of the fuse device 400 along line 3D-3D in FIG. 3A. FIGS. 3A-3D will be discussed concurrently and have been simplified for the sake of clarity to better understand the inventive concepts of the present disclosure. The embodiment of FIGS. 3A-3D is similar in many respects to the embodiment of FIGS. 1A-1D. Accordingly, similar features in FIGS. 1A-1D and FIGS. 3A-3D are identified by the same reference numerals for clarity and simplicity. Additional features can be added in the fuse device 400, and some of the features described below can be replaced or eliminated for other embodiments of the fuse device 400.

In the fuse device 400, gate structures 450 control or define the width (W) of the fuse device 400. The gate structures 450 traverse the fins 212, and in the depicted embodiment, traverse at least two portions of the fins 212, such that during processing, the metal-semiconductor alloy feature 240 forms between the gate structures 450. A width of the fuse device 400 can thus be less than that achievable by conventional processing, such as less than a resolution limit permitted by lithography processing. Where the fuse device 400 is included in a microprocessor, memory cell, or other integrated circuit device, the gate structures 450 are dummy gate structures that may be formed simultaneously with gate structures of other devices of the microprocessor, memory cell, or other integrated circuit device. The gate structures 450 are formed by a suitable process, including deposition processes, lithography patterning processes, etching processes, other suitable processes, or combinations thereof. The deposition processes include chemical vapor deposition (CVD), physical vapor deposition (PVD), atomic layer deposition (ALD), high density plasma CVD (HDP-CVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the photoresist, rinsing, drying (for example, hard baking), other suitable processes, or combinations thereof. Alternatively, the lithography exposing process is implemented or replaced by other methods, such as maskless lithography, electron-beam writing, or ion-beam writing. In yet another alternative, the lithography patterning process could implement nanoimprint technology. The etching processes include dry etching, wet etching, other etching methods, or combinations thereof.

The gate structures 450 include a gate stack that includes a gate dielectric 452 and a gate electrode 454. The gate stack of the gate structures 450 may include numerous other layers, for example, capping layers, interface layers, diffusion layers, barrier layers, hard mask layers, or combinations thereof. The gate dielectric 452 includes a dielectric material, such as silicon oxide, high-k dielectric material, other suitable dielectric material, or combinations thereof. Examples of high-k dielectric material include $HfO_2$, HfSiO, HfSiON, HfTaO, HfSiO, HfZrO, zirconium oxide, aluminum oxide, hafnium dioxide-alumina ($HfO_2$—$Al_2O_3$) alloy, other suitable high-k dielectric materials, or combinations thereof. The gate electrode 454 includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. In the depicted embodiment, the gate electrode 254 includes metal, and is formed in a gate last process.

The gate structure further includes spacers 456. The spacers 456 are disposed on sidewalls of the gate stack of the gate structure 450, such as along sidewalls of the gate dielectric 452 and the gate electrode 454. The spacers 456 include a dielectric material, such as silicon oxide, silicon nitride, silicon oxynitride, other suitable material, or combinations thereof. The spacers 456 may include a multi-layer structure, such as a multi-layer structure including a silicon nitride layer and a silicon oxide layer. The spacers are formed by a suitable process to a suitable thickness. For example, in the depicted embodiment, spacers 456 may be formed by depositing a silicon nitride layer and then dry etching the layer to form the spacers 456 as illustrated in FIGS. 3C and 3D.

Figure 4:
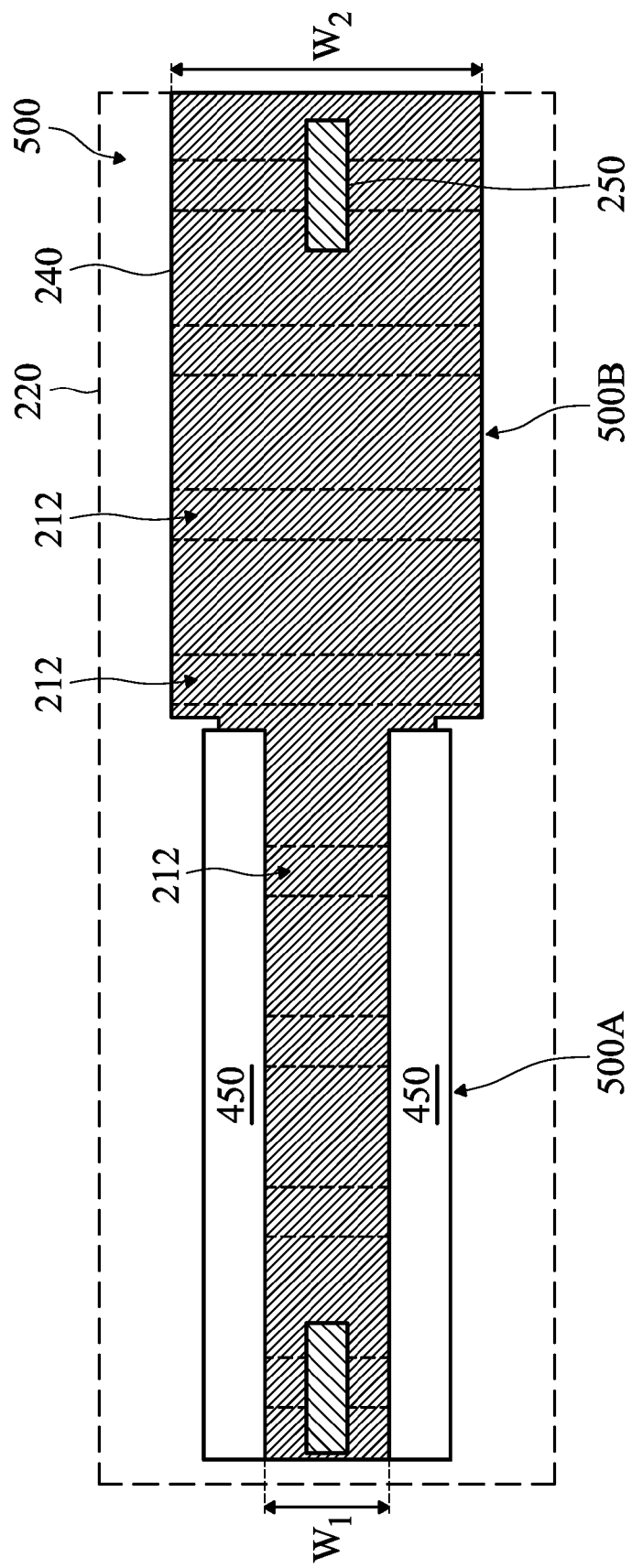
FIG. 4 is a top view of yet another embodiment of a fuse device according to various aspects of the present disclosure.

FIG. 4 is a top view of a fuse device 500, in portion or entirety, according to various aspects of the present disclosure. The embodiment of FIG. 4 is similar in many respects to the embodiment of FIGS. 1A-1D, 2A-2D, and 3A-3D. Accordingly, similar features in FIGS. 1A-1D, 2A-2D, and 3A-3D and FIG. 4 are identified by the same reference numerals for clarity and simplicity. In the depicted embodiment, the fuse device 500 has an asymmetric shape. For example, the fuse device 500 has a first portion 500A and a second portion 500B, where one of the contacts 250 is disposed over and coupled with the first portion 500A and one of the contacts 250 is disposed over and coupled with the second portion 500B. A width ($W_1$) of the first portion 500A is smaller than a width ($W_2$) of the second portion 500B. During processing, the gate structures 450 can be formed to define the width ($W_1$) of the first portion 500A, as in the depicted embodiment. In operation, the asymmetric shape of the fuse device 500 can create a temperature gradient, such that the fuse device 500 is easier to break. For example, as a current travels via the metal-semiconductor alloy feature 240 between the contacts 250, because the width ($W_1$) of the first portion 500A is smaller than the width ($W_2$) of the second portion 500B, a current density in the first portion 500A will be greater than a current density in the second portion 500B, such that a thermal energy (and thus temperature) in the first portion 500A is greater than a thermal energy (and thus temperature) in the second portion 500B. Such temperature gradient can provide improved programmability, such as improved programming current ability for breaking the fuse device 500. It is noted that the asymmetric shape of the fuse device 500 is merely an example, and that other asymmetric shapes of fuse devices that achieve desired programmability are contemplated by the present disclosure. Additional features can be added in the fuse device 500, and some of the features described below can be replaced or eliminated for other embodiments of the fuse device 500.

Figure 5:
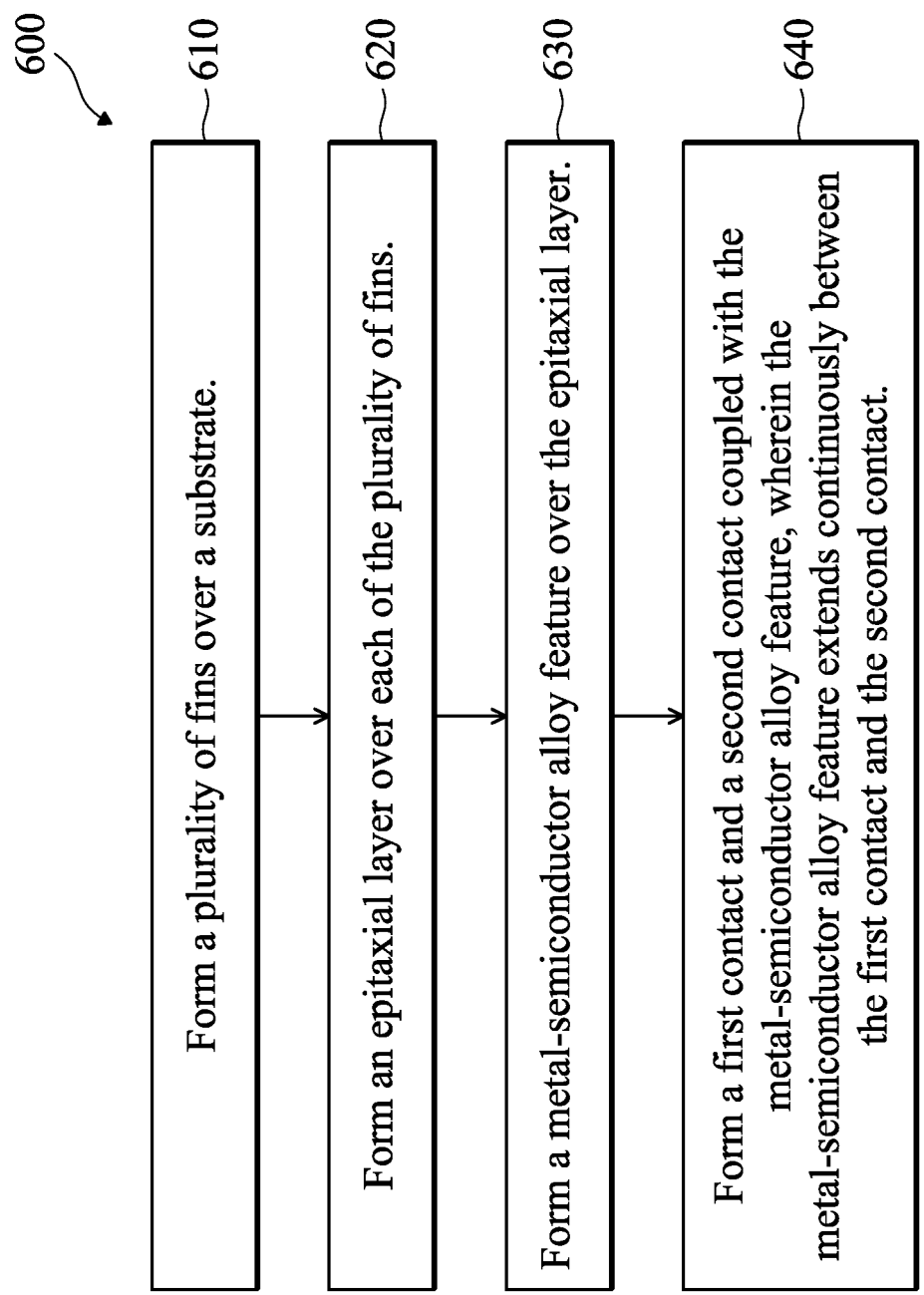
FIG. 5 is a flow chart of a method for fabricating a fuse device according to various aspects of the present disclosure.

FIG. 5 is a flow chart of a method 600 for fabricating an integrated circuit device according to various aspects of the present disclosure. In the depicted embodiment, the method 600 fabricates an integrated circuit device that includes a fuse device, specifically a FinFET based, metal-semiconductor alloy fuse device, such as fuse devices 200, 300, 400, and 500 described above with reference to FIGS. 1A-1D, 2A-2D, 3A-3D, and 4, respectively. The method 600 begins at block 610 a plurality of fins are formed over a substrate. The substrate may be similar to the substrate 210 and the fins may be similar to the fins 212 described above. At block 620, an epitaxial layer is formed over each of the plurality of fins. The epitaxial layer may be similar to the epitaxial features 230 (or continuous epitaxial feature 235) described above. At block 630, a metal-semiconductor alloy feature is formed over the epitaxial layer. The metal-semiconductor alloy feature may be similar to the metal-semiconductor alloy feature 240 described above. At block 640, a first contact and a second contact are formed that are coupled with the metal-semiconductor alloy feature, where the metal-semiconductor alloy feature extends continuously between the first contact and the second contact. The first and second contacts may be similar to the contacts 250 described above. The method 600 may continue to complete fabrication of the integrated circuit device. Additional steps can be provided before, during, and after the method 600, and some of the steps described can be replaced or eliminated for other embodiments of the method 600. For example, before the epitaxial layer is formed over each of the plurality of fins, gate structures may be formed that traverse the plurality of fins. The gate structures may be similar to the gate structures 450 described above. The metal-semiconductor alloy feature may therefore be confined to forming between the gate structures. In an example, the gate structures include a gate dielectric, such as a high-k gate dielectric layer, and a dummy gate electrode, such as a polysilicon gate electrode. In accordance with this example, the dummy gate electrode may be replaced with a metal gate after the metal-semiconductor alloy feature is formed.

It is noted that the method 600 can form the fuse devices described herein while simultaneously forming other devices of the integrated circuit device. For example, the method 600 may simultaneously form the FinFET based, metal-semiconductor alloy fuse device and a FinFET device of the integrated circuit device. The fuse devices described herein are thus compatible with conventional complementary metal-oxide-semiconductor (CMOS) processing, particularly high-k/metal gate CMOS processing. Accordingly, manufacturing costs and manufacturing time are not negatively impacted by implementing the fuse devices described herein in integrated circuit device manufacturing. Different embodiments may have different advantages, and no particularly advantage is necessarily required of any embodiment.

The present disclosure provides for many different embodiments. In an example, a device includes a semiconductor substrate; a fin structure disposed over the semiconductor substrate, wherein the fin structure includes at least two fins disposed over the substrate; an epitaxial semiconductor feature disposed over each of the at least two fins; a metal-semiconductor alloy feature disposed over the epitaxial semiconductor feature of each of the at least two fins; and a first contact and a second contact coupled with the metal-semiconductor alloy feature, wherein the metal-semiconductor alloy feature extends continuously between the first contact and the second contact. The epitaxial semiconductor feature disposed over each of the at least two fins may be merged together to form a continuous epitaxial feature disposed over the at least two fins. The epitaxial semiconductor feature may include silicon germanium. The metal-semiconductor alloy feature may include a silicide material. The semiconductor substrate may be a silicon-on-insulator substrate. A width of the metal-semiconductor alloy feature may be defined by at least two gate structures, each of the at least two gate structures traversing the at least two fins. In an example, at least two gate structures include a gate stack having a gate dielectric layer disposed over the at least two fins and a gate electrode disposed over the gate dielectric layer. The gate dielectric layer may be a high-k dielectric layer, and the gate electrode may be a metal gate electrode.

In another example, a fuse device includes a first contact and a second contact coupled with a metal-semiconductor alloy layer, wherein the metal-semiconductor alloy layer extends continuously between the first contact and the second contact. The metal-semiconductor alloy layer is disposed over an epitaxial layer that is disposed over a fin structure of a substrate. In an example, the substrate and the fin structure include silicon; the epitaxial layer includes silicon germanium; and the metal-semiconductor alloy layer includes a silicide material, such as nickel silicide, cobalt silicide, tungsten silicide, tantalum silicide, titanium silicide, platinum silicide, erbium silicide, palladium silicide, or combinations thereof. The epitaxial layer may extend continuously between fins of the fin structure. The epitaxial layer may include gaps between fins of the fin structure, where the metal-semiconductor alloy layer at least partially fills the gaps. The metal-semiconductor alloy feature may be disposed between gate structures that traverse fins of the fin structure. In an example, the metal-semiconductor alloy feature has a first portion having a first width and a second portion having a second width, the second width being larger than the first width, where the first contact is coupled with the first portion and the second contact is coupled with the second portion. The first portion of the metal-semiconductor alloy feature may be disposed between gate structures that traverse fins of the fin structure, such that the first width of the first portion is defined by the gate structures.

In yet another example, a method includes forming a plurality of fins over a substrate; forming an epitaxial layer over each of the plurality of fins; forming a metal-semiconductor alloy feature over the epitaxial layer; and forming a first contact and a second contact coupled with the metal-semiconductor alloy feature, wherein the metal-semiconductor alloy feature extends continuously between the first contact and the second contact. Forming the epitaxial layer over each of the plurality of fins may include epitaxially growing a semiconductor material on each of the plurality of fins until the semiconductor material grown on each of the plurality of fins merges together to form a continuous epitaxial layer. The method may further include forming gate structures that traverse the plurality of fins before forming the epitaxial layer. The method may further include replacing a dummy gate of the gate structures with a metal gate after forming the metal-semiconductor alloy feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a plurality of fins over a substrate, the plurality of fins including a first fin and a second fin;
    after forming the first fin and the second fin over the substrate, forming a dielectric isolation layer in the substrate extending between a first sidewall of the first fin and a second sidewall of the second fin, such that the dielectric isolation layer physically contacts the first sidewall of the first fin and the second sidewall of the second fin;
    forming an epitaxial layer directly above a top surface of each of the plurality of fins that faces away from the substrate and directly above a top surface of the dielectric isolation layer that faces away from the substrate;
    forming a metal-semiconductor alloy feature over the epitaxial layer; and
    forming a first contact and a second contact coupled with the metal-semiconductor alloy feature, wherein the metal-semiconductor alloy feature extends continuously between the first contact and the second contact.

2. The method of claim 1, wherein forming the epitaxial layer directly above the top surface of each of the plurality of fins includes epitaxially growing a semiconductor material on each of the plurality of fins until the semiconductor material grown on each of the plurality of fins merges together to form a continuous epitaxial layer.

3. The method of claim 1 further including, before forming the epitaxial layer, forming a gate structure that traverses the first and second fins, the gate structure including a dummy gate.

4. The method of claim 3 further including, after forming the metal-semiconductor alloy feature, replacing the dummy gate with a metal gate.

5. The method of claim 1, wherein the substrate includes a semiconductor substrate and forming the plurality of fins over the substrate includes forming the plurality of fins directly on the semiconductor substrate such that the plurality of fins physically contact the semiconductor substrate.

6. The method of claim 1, wherein forming the metal-semiconductor alloy feature over the epitaxial layer includes forming the metal-semiconductor alloy feature between a first gate and a second gate such that the metal-semiconductor alloy feature extends between a first sidewall of the first gate and a second sidewall of the second gate.

7. A method comprising:
    forming a first fin and a second fin over a semiconductor substrate, wherein the first fin has a first sidewall and the second fin has a second sidewall facing the first sidewall of the first fin;
    after forming the first fin and a second fin over the semiconductor substrate, forming a dielectric isolation feature within the semiconductor substrate, wherein the dielectric isolation feature extends between the first sidewall of the first fin and the second sidewall of the second fin, wherein the dielectric isolation feature physically contacts the first sidewall of the first fin and the second sidewall of the second fin;
    forming a first epitaxial feature directly above a top surface of the first fin and directly above a top surface of the dielectric isolation feature and forming a second epitaxial feature directly above a top surface of the second fin, the top surfaces of the first fin, the second fin, and the dielectric isolation feature facing away from the semiconductor substrate;
    forming a conductive feature over the first and second epitaxial features; and
    forming a first contact and a second contact coupled with the conductive feature, wherein the conductive feature extends continuously from the first contact to the second contact.

8. The method of claim 7, wherein the first and second epitaxial features are merged with each other to form a continuous epitaxial layer.

9. The method of claim 7, wherein at least one of the first and second fins physically contacts the semiconductor substrate.

10. The method of claim 7, wherein the conductive feature includes a metal-semiconductor alloy material.

11. The method of claim 7, further comprising forming a first gate structure over the first fin and forming a second gate structure over the first fin.

12. The method of claim 11, wherein forming the conductive feature over the first and second epitaxial features includes forming the conductive feature between the first and second gate structures such that the conductive feature extends from the first gate structure to the second gate structure.

13. The method of claim 11, wherein forming the first gate structure over the first fin includes:
forming a high-k dielectric layer over the first fin; and
forming a metal gate electrode over the high-k dielectric layer.

14. A method comprising:
forming a first fin and a second fin over a semiconductor substrate such that at least one of the first and second fins physically contacts the semiconductor substrate;
forming a dielectric isolation feature within the semiconductor substrate, wherein the dielectric isolation feature extends between a first sidewall of the first fin and a second sidewall of the second fin, wherein the dielectric isolation feature physically contacts the first sidewall of the first fin and the second sidewall of the second fin;
forming a first epitaxial feature directly above a top surface of the first fin that faces away from the semiconductor substrate and a second epitaxial feature directly above a top surface of the second fin that faces away from the semiconductor substrate and directly above a top surface of the dielectric isolation feature that faces away from the semiconductor substrate;
forming a metal-semiconductor alloy feature over the first and second epitaxial features; and
forming a first contact and a second contact coupled with the metal-semiconductor alloy feature, wherein the metal-semiconductor alloy feature extends continuously from the first contact to the second contact.

15. The method of claim 14, wherein the first epitaxial feature includes silicon germanium, and
wherein the metal-semiconductor alloy feature includes a silicide material.

16. The method of claim 15, wherein the silicide material includes at least one material selected from the group of nickel silicide, cobalt silicide, tungsten silicide, tantalum silicide, titanium silicide, platinum silicide, erbium silicide, palladium silicide, or combinations thereof.

17. The method of claim 14, further comprising forming a gate structure over the first fin prior to forming the first epitaxial feature directly above the top surface of the first fin and the second epitaxial feature directly above the top surface of the second fin.

18. The method of claim 14, wherein forming the first epitaxial feature directly above the top surface of the first fin and the second epitaxial feature directly above the top surface of the second fin includes merging the first and second epitaxial features together such that the first and second epitaxial features form a continuous epitaxial layer.

19. The method of claim 6, further comprising:
forming the epitaxial layer such that a bottom surface of the epitaxial layer contacts the top surface of the dielectric isolation layer; and
forming the metal-semiconductor alloy feature such that a bottom surface of the metal-semiconductor alloy feature contacts a top surface of the epitaxial layer.

20. The method of claim 19, wherein a spacer of the first gate physically contacts a sidewall of the epitaxial layer.

* * * * *